(12) United States Patent
Basker et al.

(10) Patent No.: US 8,940,602 B2
(45) Date of Patent: Jan. 27, 2015

(54) SELF-ALIGNED STRUCTURE FOR BULK FINFET

(71) Applicant: International Business Machines Corporation, Armonk, NY (US)

(72) Inventors: Veeraraghavan S. Basker, Schnectady, NY (US); Effendi Leobandung, Wappingers Falls, NY (US); Tenko Yamashita, Schenectady, NY (US); Chun-Chen Yeh, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/860,832

(22) Filed: Apr. 11, 2013

(65) Prior Publication Data

US 2014/0306289 A1 Oct. 16, 2014

(51) Int. Cl.
| | | |
|---|---|---|
| H01L 21/04 | (2006.01) | |
| H01L 27/12 | (2006.01) | |
| H01L 21/762 | (2006.01) | |
| H01L 29/66 | (2006.01) | |
| H01L 29/78 | (2006.01) | |

(52) U.S. Cl.
CPC ........ *H01L 21/762* (2013.01); *H01L 29/66795* (2013.01); *H01L 29/785* (2013.01)
USPC ........... 438/249; 438/176; 438/177; 257/368; 257/E21.623; 257/E27.065; 257/E27.066; 257/E27.067

(58) Field of Classification Search
CPC ..................... H01L 29/66795; H01L 29/7848; H01L 21/823821; H01L 21/845; H01L 27/1211; H01L 21/2033; H01L 21/28017; H01L 21/36; H01L 21/20; H01L 29/7831; H01L 21/76; H01L 21/762; H01L 21/76213; H01L 21/76218; H01L 21/76237; H01L 21/76267; H01L 21/76278; H01L 21/76283; H01L 21/76297; H01L 21/823493; H01L 21/3892; H01L 27/0927; H01L 27/0925; H01L 27/0928; H01L 1/76237; H01L 21/0455; H01L 21/22; H01L 21/225; H01L 21/228; H01L 21/385; H01L 2224/8083
USPC .......... 438/249, 176, 177; 257/368, E21.623, 257/E27.065, E27.066, E27.067
See application file for complete search history.

(56) References Cited

U.S. PATENT DOCUMENTS

| | | | |
|---|---|---|---|
| 5,972,758 A | * | 10/1999 | Liang ............................ 438/294 |
| 6,642,090 B1 | * | 11/2003 | Fried et al. .................... 438/164 |

(Continued)

OTHER PUBLICATIONS

Prosecution History of related U.S. Appl. No. 14/015,967, Office Action dated May 22, 2014, all pages.

(Continued)

*Primary Examiner* — Jarrett Stark
*Assistant Examiner* — Bitew Dinke
(74) *Attorney, Agent, or Firm* — Law Offices of Ira D. Blecker, P.C.

(57) ABSTRACT

A FinFET structure which includes a bulk semiconductor substrate; semiconductor fins extending from the bulk semiconductor substrate, each of the semiconductor fins having a top portion and a bottom portion such that the bottom portion of the semiconductor fins is doped and the top portion of the semiconductor fins is undoped; a portion of the bulk semiconductor substrate directly underneath the plurality of semiconductor fins being doped to form an n+ or p+ well; and an oxide formed between the bottom portions of the fins. Also disclosed is a method for forming a FinFET device.

10 Claims, 14 Drawing Sheets

(56) References Cited

U.S. PATENT DOCUMENTS

| | | | |
|---|---|---|---|
| 7,101,763 | B1 | 9/2006 | Anderson et al. |
| 7,279,774 | B2 | 10/2007 | Seo et al. |
| 7,517,764 | B2 | 4/2009 | Booth, Jr. et al. |
| 7,531,423 | B2 | 5/2009 | Cheng et al. |
| 7,968,442 | B2 * | 6/2011 | Kang et al. .................... 438/585 |
| 8,030,707 | B2 * | 10/2011 | Cheng et al. ................. 257/347 |
| 8,039,326 | B2 | 10/2011 | Knorr et al. |
| 8,691,640 | B1 * | 4/2014 | LiCausi et al. ................ 438/156 |
| 2003/0068867 | A1 * | 4/2003 | Forster et al. ................ 438/386 |
| 2003/0211670 | A1 * | 11/2003 | Downey ........................ 438/197 |
| 2004/0150029 | A1 * | 8/2004 | Lee .............................. 257/308 |
| 2007/0018239 | A1 | 1/2007 | Chen et al. |
| 2007/0164397 | A1 * | 7/2007 | Cheng et al. ................. 257/542 |
| 2007/0221956 | A1 * | 9/2007 | Inaba ........................... 257/197 |
| 2008/0149984 | A1 * | 6/2008 | Chang et al. ................. 257/314 |
| 2008/0311715 | A1 * | 12/2008 | Hu et al. ...................... 438/278 |
| 2011/0146782 | A1 * | 6/2011 | Gabor et al. ................. 136/256 |
| 2011/0169101 | A1 | 7/2011 | Doornbos et al. |
| 2011/0269287 | A1 * | 11/2011 | Tsai et al. .................... 438/306 |
| 2012/0086053 | A1 * | 4/2012 | Tseng et al. .................. 257/288 |
| 2013/0122676 | A1 * | 5/2013 | Jeng ............................. 438/306 |
| 2013/0146895 | A1 * | 6/2013 | Tsai et al. ..................... 257/77 |
| 2013/0175661 | A1 * | 7/2013 | Cai et al. ...................... 257/506 |
| 2013/0316513 | A1 * | 11/2013 | BASKER et al. ............ 438/400 |
| 2014/0024182 | A1 * | 1/2014 | Goto et al. .................... 438/163 |
| 2014/0124863 | A1 * | 5/2014 | Cheng et al. ................. 257/350 |

OTHER PUBLICATIONS

Prosecution History of related U.S. Appl. No. 14/015,967, Amendment filed Aug. 22, 2014 to Office Action dated May 22, 2014, all pages.

T. Izumida et al., "Advantage of Plasma Doping for Source/Drain Extension in Bulk Fin Field Effect Transistor," Japanese Journal of Applied Physics, vol. 50, 2011, 04DC15, 6 pages.

. V. Jovanović et al., "Sub-100 nm silicon-nitride hard-mask for high aspect-ratio silicon fins," Proceedings of MIPRO, May 2007, 5 pages.

* cited by examiner

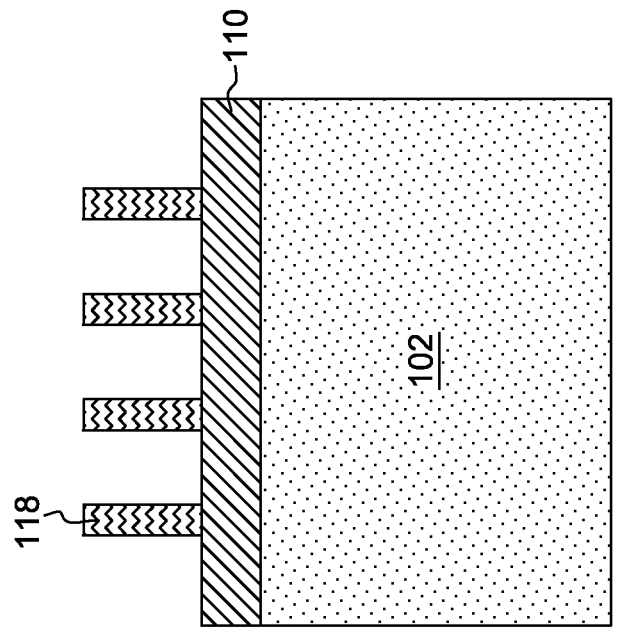
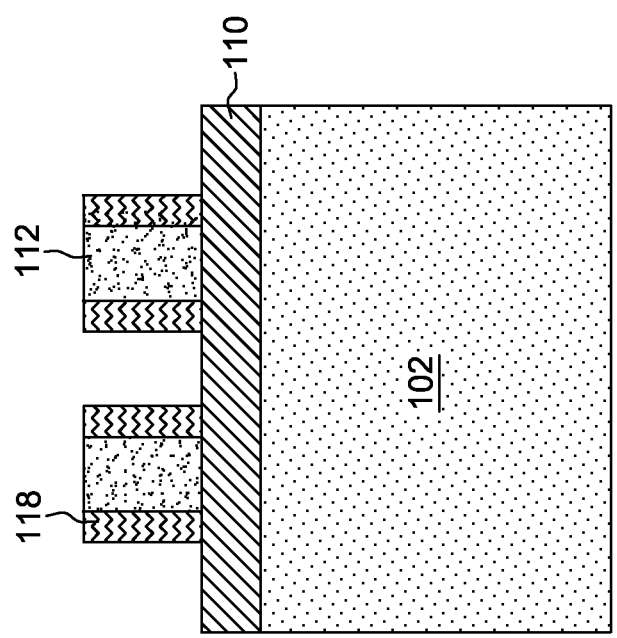

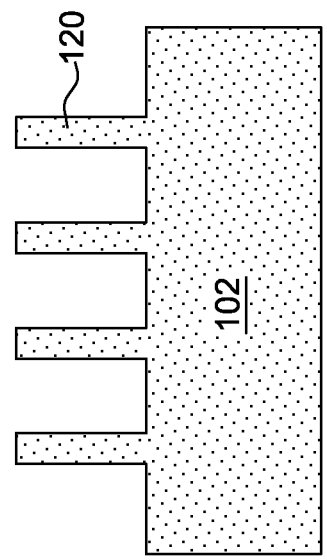
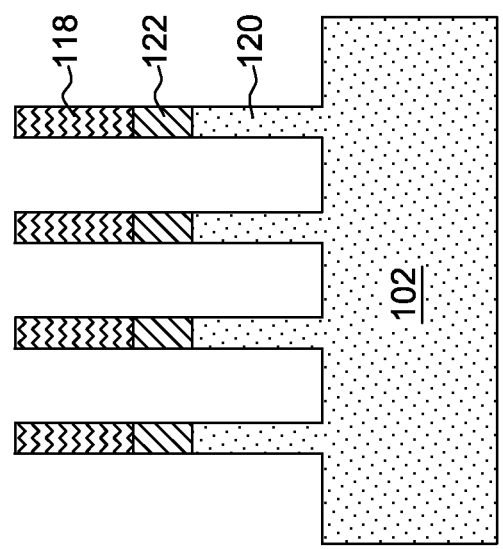

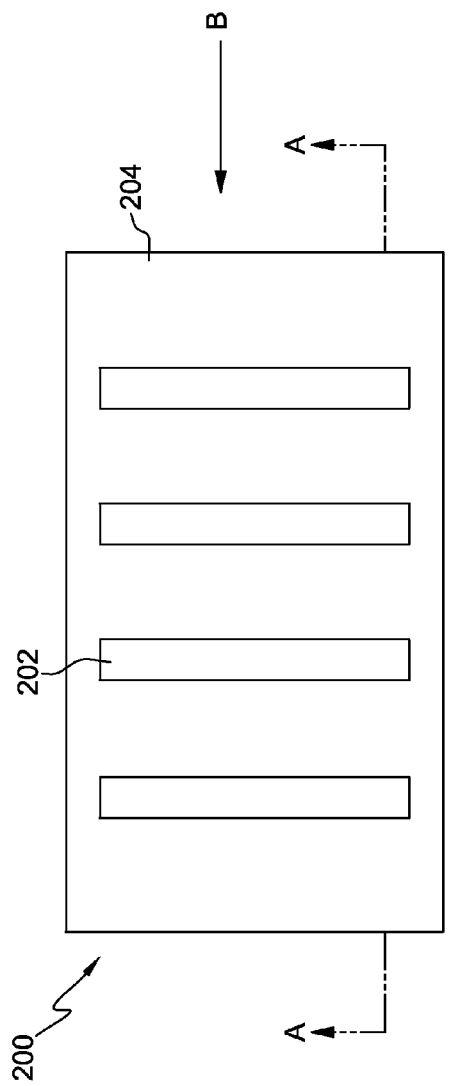
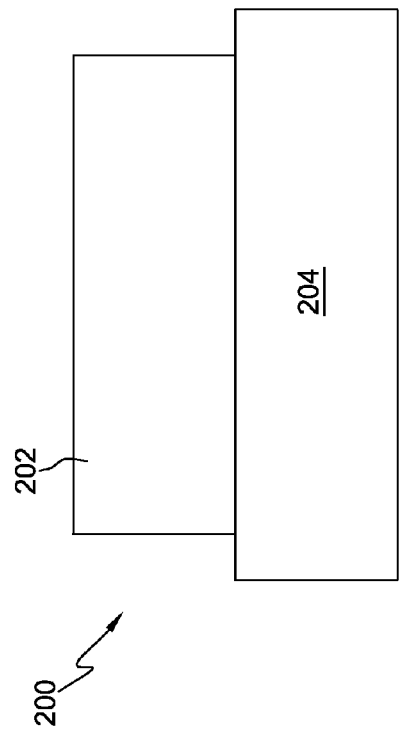

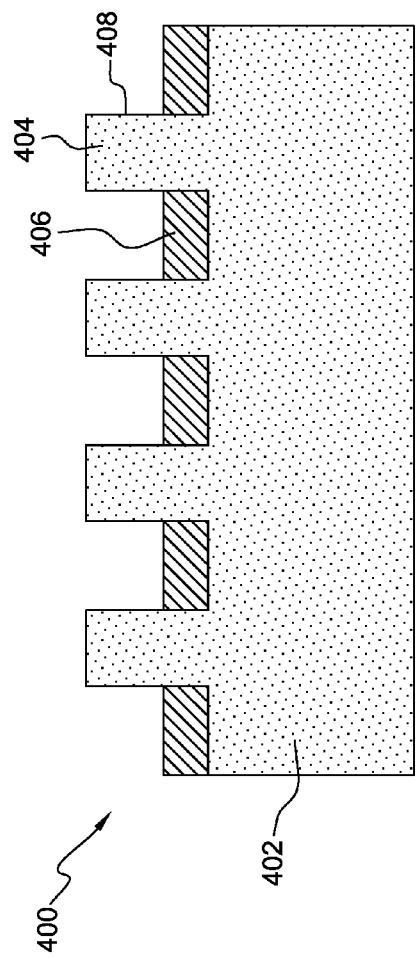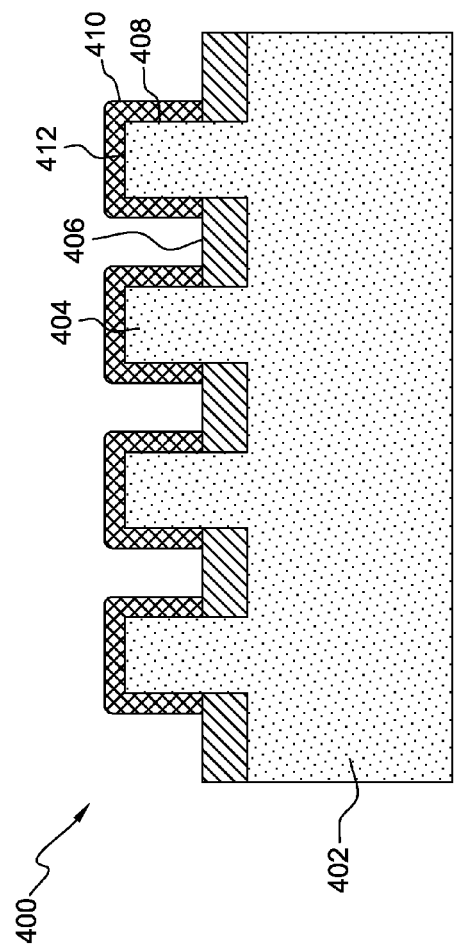
FIG. 4
FIG. 5

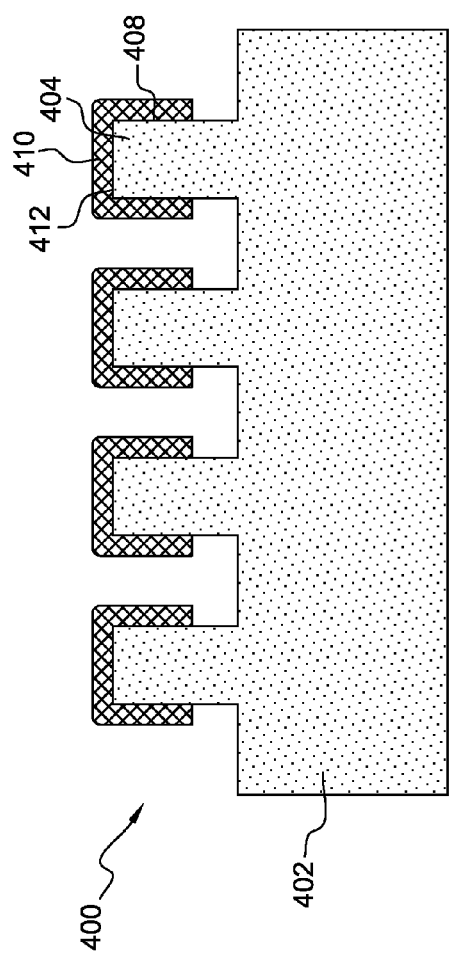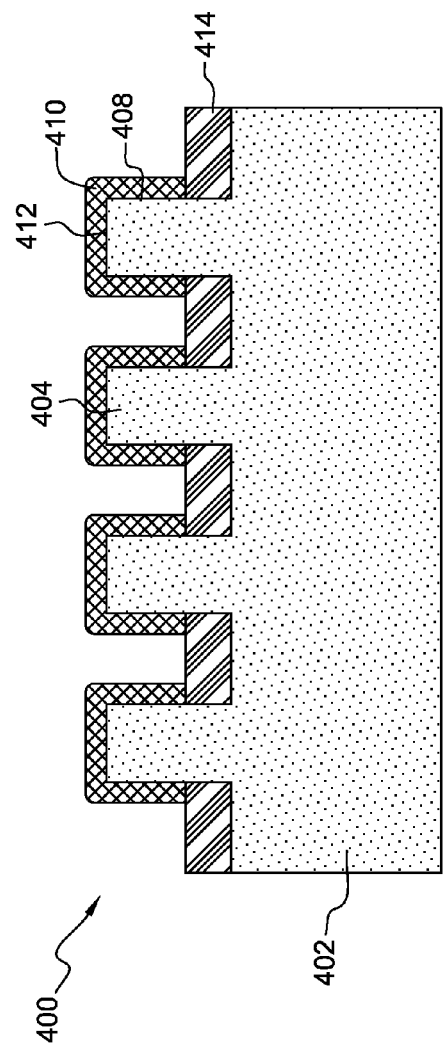

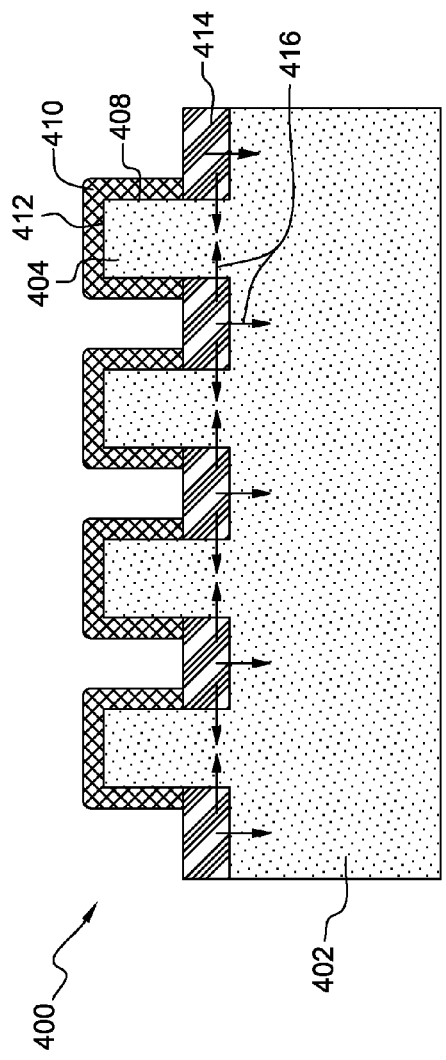
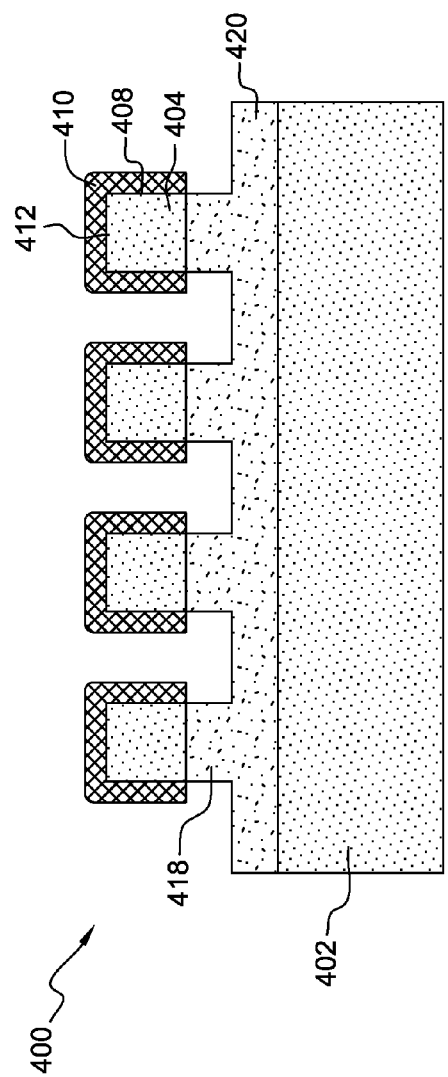

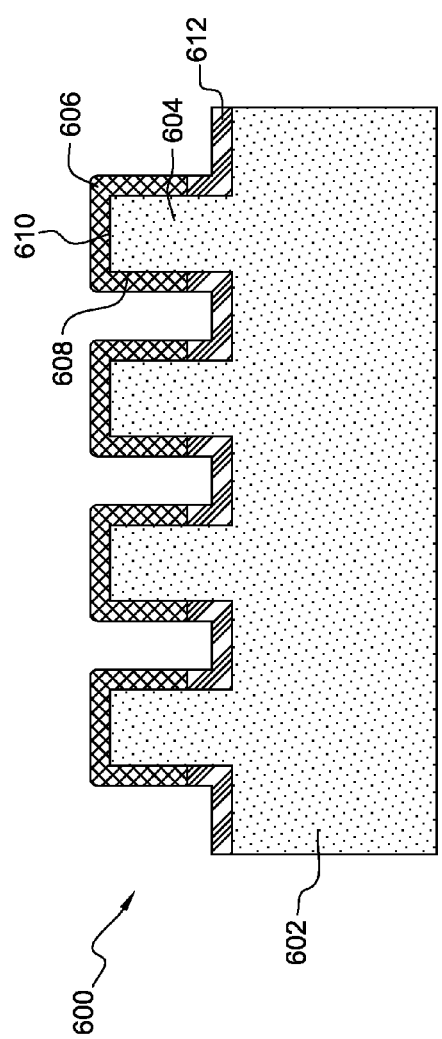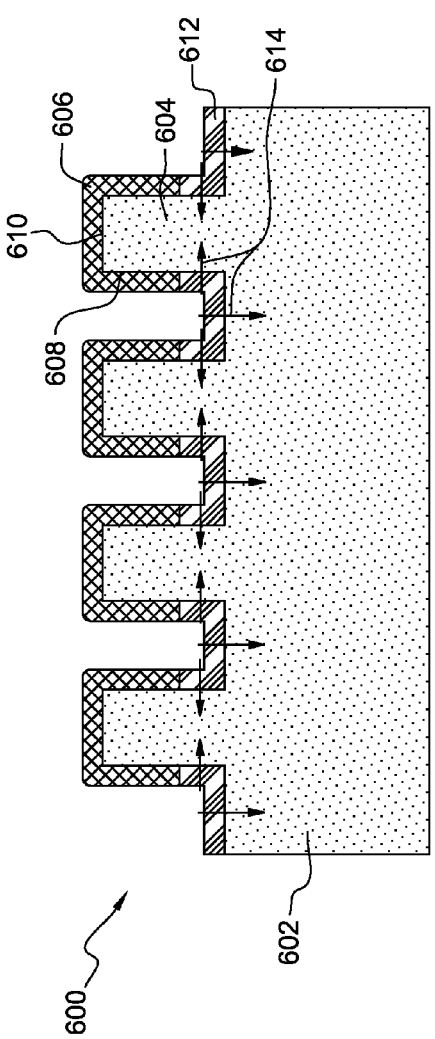

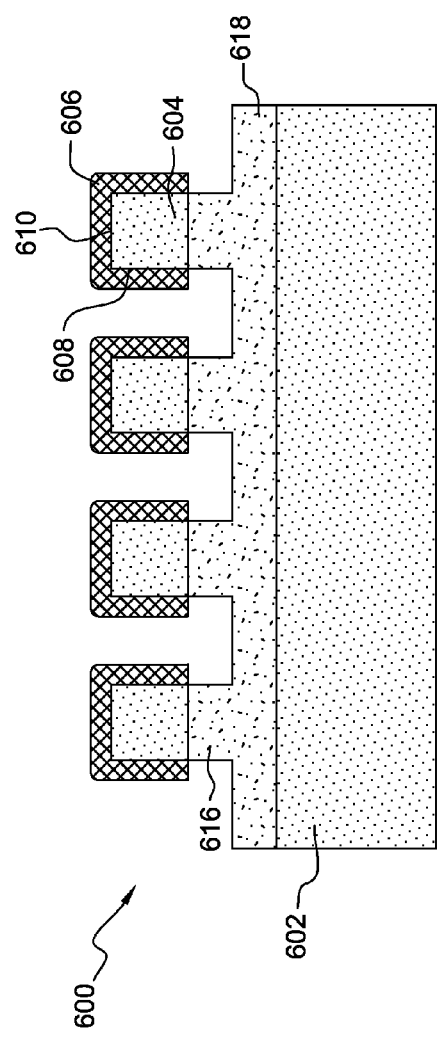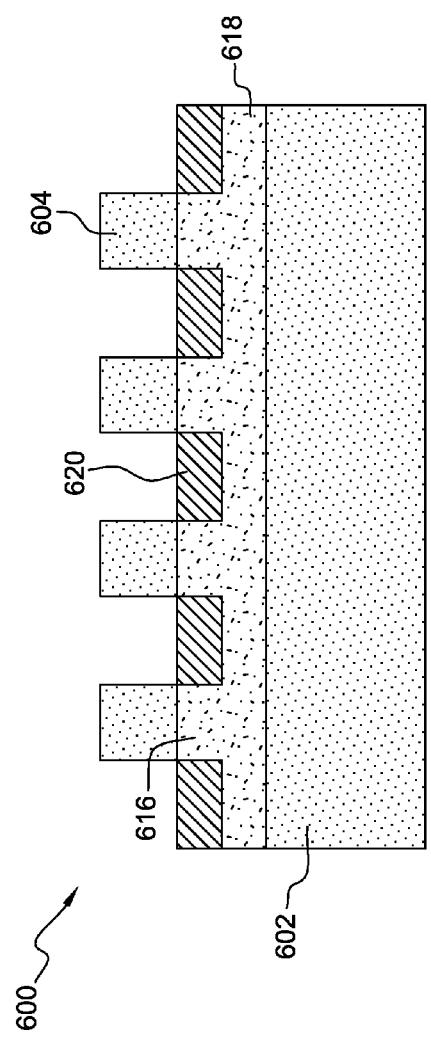

SELF-ALIGNED STRUCTURE FOR BULK FINFET

BACKGROUND

The present invention relates to bulk FinFET devices and, more particularly, relates to bulk FinFET devices having uniform high concentration well doping to block the electrical path between the source and drain and minimize the junction leakage current.

In contrast to traditional planar metal-oxide-semiconductor field-effect transistors (MOSFETS), which are fabricated using conventional lithographic fabrication methods, nonplanar FETs (Field-Effect Transistors) incorporate various vertical transistor structures, and typically include two or more gate structures formed in parallel. One such semiconductor structure is the "FinFET" which takes its name from the multiple thin silicon "fins" that are used to form the respective gate channels.

More particularly, a FinFET device generally includes one or more parallel silicon fin structures (or simply "fins"). The fins extend between a common source electrode and a common drain electrode. A conductive gate structure "wraps around" three sides of the fins, and may be separated from the fins by a standard gate insulator layer. Fins may be suitably doped to produce the desired FET polarity, as is known in the art, such that a gate channel is formed within the fins adjacent to the gate insulator.

Fin structures (and thus FinFET devices) may be formed on a semiconductor substrate. The semiconductor substrate may be a silicon on insulator (SOI) wafer. The silicon on insulator (SOI) wafer comprises a silicon-comprising material layer overlying a silicon oxide layer. Fin structures are formed from the silicon-comprising material layer. The SOI wafer is supported by a support substrate which may also be silicon or another semiconducting material.

Alternatively, the semiconductor substrate may be a bulk silicon wafer from which the fin structures are formed. The bulk silicon wafer comprises a monolithic block of single crystal silicon. A FinFET device formed from a bulk silicon wafer is referred to herein as a "bulk FinFET device".

Electrical isolation between adjacent fins and between the source and drain electrodes of unrelated FinFET devices is needed. "Unrelated" as used herein means that the devices are not intended to be coupled together. Electrical current leakage is a parasitic effect, which degrades performance of an integrated circuit.

BRIEF SUMMARY

The various advantages and purposes of the exemplary embodiments as described above and hereafter are achieved by providing, according to a first aspect of the exemplary embodiments, a method of forming a FinFET device which includes: forming a plurality of semiconductor fins from a bulk semiconductor substrate; forming an oxide layer between each of the plurality of semiconductor fins, the oxide layer extending from the bulk semiconductor substrate only part way up a sidewall of each the semiconductor fins to cover a bottom portion of each of the semiconductor fins, a top portion of the sidewall of each of the semiconductor fins being exposed; forming a dummy spacer on the top portion of each of the semiconductor fins; stripping the oxide layer to expose the bulk semiconductor substrate and the bottom portion of each of the semiconductor fins; depositing a doping material to be in contact with the exposed bulk semiconductor substrate and the bottom portion of each of the semiconductor fins; heat treating the bulk semiconductor substrate to drive in dopants from the doping material into the exposed bulk semiconductor substrate and the bottom portion of each of the semiconductor fins; stripping the doping material; depositing a second oxide layer in contact with the exposed bulk semiconductor substrate and the bottom portion of each of the semiconductor fins; and stripping the dummy spacer from each of the semiconductor fins.

According to a second aspect of the exemplary embodiments, there is provided a FinFET structure which includes: a bulk semiconductor substrate; a plurality of semiconductor fins extending from the bulk semiconductor substrate, each of the plurality of semiconductor fins having a top portion and a bottom portion such that the bottom portion of the semiconductor fins is doped and the top portion of the semiconductor fins is undoped; a portion of the bulk semiconductor substrate directly underneath the plurality of semiconductor fins being doped to form an n+ or p+ well; and an oxide formed between the bottom portions of the fins.

BRIEF DESCRIPTION OF SEVERAL VIEWS OF THE DRAWINGS

The features of the exemplary embodiments believed to be novel and the elements characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

FIGS. 1A to 1H illustrate a process for forming fins on a bulk silicon substrate wherein:

FIG. 1A illustrates a starting structure including a bulk silicon substrate, an oxide layer, an amorphous silicon layer and a hard mask layer;

FIG. 1B illustrates the patterning of the amorphous silicon layer and the hard mask layer;

FIG. 1C illustrates the removal of the hard mask layer, leaving only stripes of amorphous silicon;

FIG. 1D illustrates the deposition of a conformal layer of nitride;

FIG. 1E illustrates the etching of the nitride to form sidewall spacers;

FIG. 1F illustrates the etching of the stripes of amorphous silicon to leave only the sidewall spacers;

FIG. 1G illustrates the etching of the oxide layer and the silicon bulk substrate using the sidewall spacers as a mask to result in stripes of oxide on silicon fins; and FIG. 1H illustrates the etching of the sidewall spacers and the oxide stripes to result in silicon fins formed from the bulk silicon substrate.

FIG. 2 is a plan view of a beginning FinFET structure comprising a plurality of silicon fins on a bulk silicon substrate.

FIG. 3 is a side view of the FinFET structure of FIG. 2 in the direction of arrow B illustrating a fin on the bulk silicon substrate.

FIGS. 4 to 10 illustrate a first exemplary process for forming a self-aligned structure for a FinFET wherein FIGS. 4 to 10 are cross-sectional views in the direction of arrows A-A in FIG. 2 wherein:

FIG. 4 illustrates the formation of an oxide layer between a plurality of silicon fins formed from a bulk silicon substrate;

FIG. 5 illustrates the formation of a dummy spacer on each of the silicon fins;

FIG. 6 illustrates the removal of the oxide layer;

FIG. 7 illustrates the formation of an epitaxial layer in the space formerly occupied by the oxide layer;

FIG. 8 illustrates the drive-in of the dopants from the epitaxial layer;

FIG. 9 illustrates the removal of the epitaxial layer and, after removal of the epitaxial layer, the resulting doped portions of the silicon fins and the bulk silicon substrate; and FIG. 10 illustrates the removal of the dummy spacer and the deposition of a second oxide layer.

FIGS. 11 to 14 illustrate a second exemplary process for forming a self-aligned structure for a FinFET wherein FIGS. 11 to 14 are cross-sectional views in the direction of arrows A-A in FIG. 2 wherein:

FIG. 11 illustrates a starting structure as illustrated in FIG. 6 and then adding a plasma doping layer in the space formerly occupied by the oxide layer;

FIG. 12 illustrates the drive-in of the dopants from the plasma doping layer;

FIG. 13 illustrates the removal of the plasma doping layer and, after removal of the plasma doping layer, the resulting doped portions of the silicon fins and the bulk silicon substrate; and FIG. 14 illustrates the removal of the dummy spacer and the deposition of a second oxide layer.

FIGS. 15 to 18 illustrate a third exemplary process for forming a self-aligned structure for a FinFET wherein FIGS. 15 to 18 are cross-sectional views in the direction of arrows A-A in FIG. 2 wherein:

FIG. 15 illustrates a starting structure as illustrated in FIG. 6 and then thinning bottom portions of the semiconductor fins;

FIG. 16 illustrates the deposition of an epitaxial layer and the drive-in of the dopants from the epitaxial layer;

FIG. 17 illustrates the removal of the epitaxial layer and, after removal of the epitaxial layer, the resulting doped portions of the silicon fins and the bulk silicon substrate; and FIG. 18 illustrates the removal of the dummy spacer and the deposition of a second oxide layer.

DETAILED DESCRIPTION

Referring now to FIGS. 1A to 1H, there is illustrated a preferred process for fabricating a bulk semiconductor substrate having fins for practicing the exemplary embodiments. The preferred process may be referred to as the sidewall image transfer process.

Figure 1B:
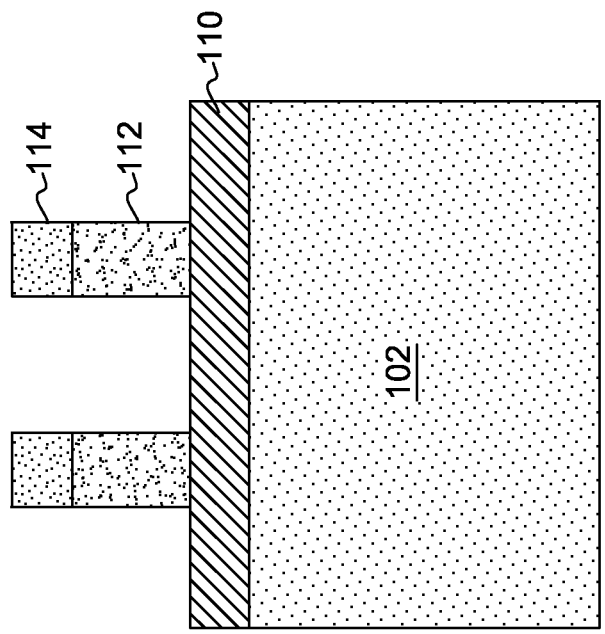
Figure 1A:
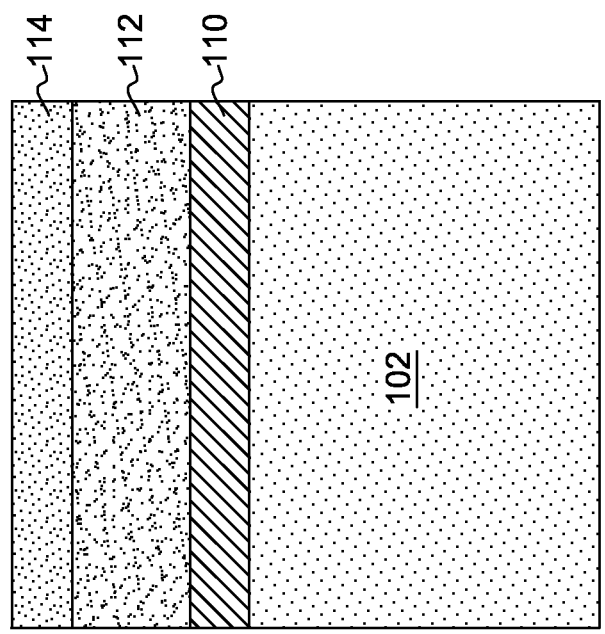

In FIG. 1A, the process begins with a bulk semiconductor substrate 102 which preferably is silicon but may be any other semiconductor material known now or in the future. For the purposes of the present exemplary embodiments, it is preferred that the bulk semiconductor substrate 102 is silicon and will be referred to as such in the discussion that follows. On top of bulk silicon substrate 102 is an oxide layer 110, followed by an amorphous silicon layer 112 and hard mask layer 114, usually a nitride. Not shown in FIG. 1A are photoresist and other layers which may be used to pattern the hard mask layer 114.

Referring now to FIG. 1B, the hard mask layer 114 has been patterned and etched down through the amorphous silicon layer 112, stopping on the oxide layer 110.

Figure 1D:
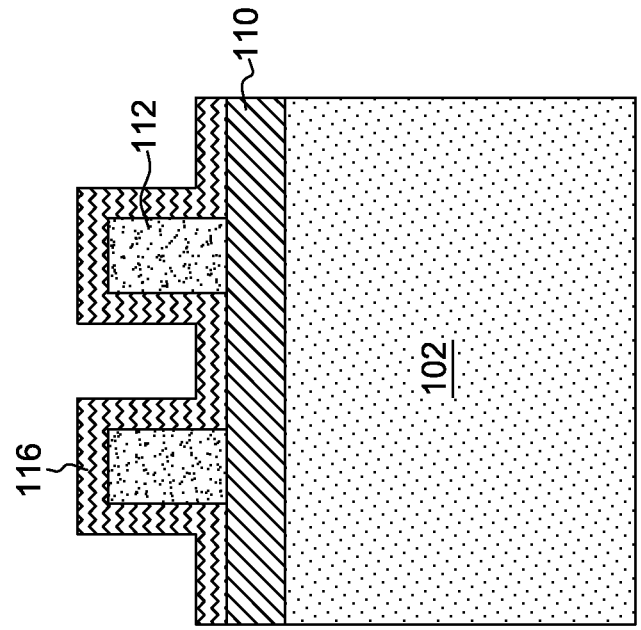
Figure 1C:
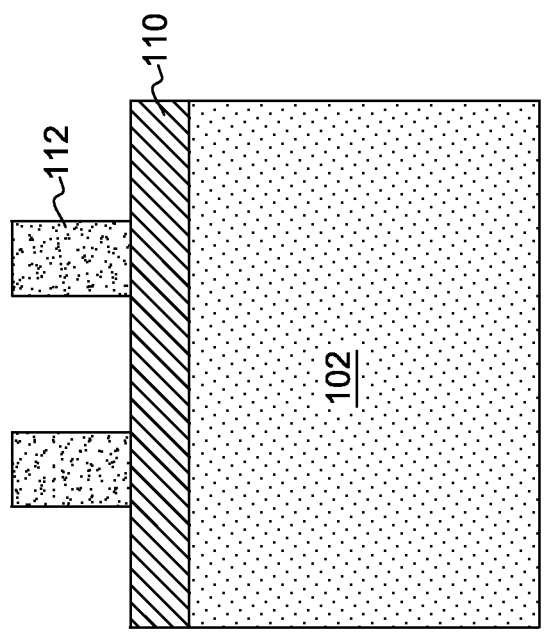

Referring now to FIG. 1C, the hard mask layer 114 has been conventionally stripped, leaving only stripes of amorphous silicon 112. Shown in FIG. 1C are only the ends of the stripes of amorphous silicon 112 which run perpendicular to the page.

Thereafter, a conformal layer of nitride 116 is deposited over the stripes of amorphous silicon 112, as shown in FIG. 1D.

The conformal layer of nitride 116 is conventionally etched to form sidewall spacers 118, as shown in FIG. 1E, followed by conventionally etching the stripes of amorphous silicon 112 to result in only the spacers 118 left on the surface of oxide layer 110, as shown in FIG. 1F.

Using the spacers 118 as a mask, the bulk silicon substrate 102 is etched to form silicon fins 120 extending from the bulk silicon substrate 102 and stripes of oxide 122 on the silicon fins 120 as shown in FIG. 1G.

Referring now to FIG. 1H, the spacers 118 and stripes of oxide 122 are conventionally etched to result in silicon fins 120 on the remaining bulk silicon substrate 102.

Referring now to FIG. 2, there is illustrated a plan view of a starting FinFET structure 200 comprising a plurality of spaced-apart fins 202 on bulk silicon substrate 204. The fins 202 may be formed in a process such as that illustrated in FIGS. 1A to 1H.

FIG. 3 is a side view of the FinFET structure 200 of FIG. 2 in the direction of arrow B illustrating a fin 202 on bulk silicon substrate 204.

In a subsequent process flow, the fins 202 will receive a gate structure (not shown) wrapping around the fins 202. Prior to forming of the gate structure, the fins 202 of FinFET structure 200 may be doped as will be described in the following description. Some of the doped fins and gate structures formed thereon may result in N-type FinFETs (NFETS) while others of the doped fins and gate structures may result in P-type FinFETs (PFETS). The present exemplary embodiments are applicable to both NFET and PFET devices.

FIGS. 4 to 10 illustrate a first exemplary process for doping of the fins wherein FIGS. 4 to 10 are cross-sectional views in the direction of arrows A-A in FIG. 2.

Referring now to FIG. 4, there is illustrated a starting FinFET structure 400 which includes a bulk silicon substrate 402 having a plurality of silicon fins 404. The silicon fins 404 preferably may be formed using the process in FIGS. 1A to 1H. An oxide 406 has been deposited over and between the silicon fins 404, planarized by a conventional process such as chemical mechanical polishing so that the oxide 406 is level with the tops of the silicon fins 404 and then etched back by a conventional process such as reactive ion etching (RIE) so that the oxide 406 has been pulled back to expose the sidewalls 408 of the silicon fins 404. The oxide 406 may be about one half of the height of the silicon fins 404.

Referring now to FIG. 5, dummy nitride spacers 410 have been formed on the sidewalls 408 and tops 412 of the silicon fins 408. In one exemplary embodiment, nitride such as silicon nitride has been deposited over the silicon fins 404 and bulk silicon substrate 402 and then etched back by a conventional process such as RIE to leave a dummy spacer on the sidewalls 408 and tops 412 of the silicon fins 404. In another exemplary embodiment, the tops 412 of silicon fins 404 may have a hard mask (not shown) and then additional nitride is deposited and etched by RIE to form dummy spacers 410 on the sidewalls 408 of the silicon fins 404.

Thereafter, the oxide 406 is stripped using, for example, a wet etch of dilute hydrofluoric acid (dHF) to result in the structure shown in FIG. 6.

The FinFET structure 400 then undergoes an epitaxial process to grow either phosphorous-doped silicon (P-silicon) or boron-doped silicon germanium (B-SiGe) on the exposed portions of the silicon fins 404 and the bulk silicon substrate 402. The FinFET structure 400 is contacted with hydrofluoric acid (HF) to remove native oxide then undergoes a 700 to 800° C. prebake to completely purge out the oxygen on the surface. Once that part is completed, $SiH_4$ (or $GeH_4$) and $B_2H_6$ or $SiH_4$ and $PH_3$ is flowed into the chamber at a control temperature of 600° C. for about 800 seconds for the epitaxial process at the surface of the silicon to form either epitaxial P-silicon, B-silicon, or B-SiGe. The epitaxial material 414 is shown in FIG. 7 where the oxide 406 (shown in FIG. 5) used to be.

Referring to FIG. 8, the FinFET structure 400 undergoes either a rapid thermal anneal (RTA) at about 1025° C. for a very short time, about a millisecond or a furnace anneal at about 700° C. for about 30 minutes to drive in the dopants (represented by arrows 416) to the bulk silicon substrate 402 and the portions of the silicon fins 404 exposed to the epitaxial material 414. The dummy spacer 410 protects the upper sidewalls 408 and the tops 412 of the fins 404 from the epitaxial material 414 and the drive in of the dopants from the epitaxial material 414.

The epitaxial material 414 may be stripped by, for example, hydrochloric acid. The bottom portions 418 of the fins 404 become doped after the drive in of the dopants from the epitaxial material 414. The doped portion of the bulk silicon substrate 402 forms a well indicated by reference number 420. The well may have a thickness of about 30 nm. For a PFET device, P-silicon may be used as the epitaxial material 414 and an n+ well 420 is formed. The bulk silicon substrate 402 is p–. For an NFET device, B-silicon germanium or B-silicon may be used as the epitaxial material 414 and a p+ well 420 is formed. The bulk silicon substrate 402 is p–. For this process step, it doesn't matter whether B-silicon or B-silicon germanium is epitaxially deposited since it is the boron dopant that is of interest; the epitaxial layer is removed in a subsequent process step. For both PFET and NFET devices, the dopant concentration in the bottom portions 418 of the fins 404 and well 420 is about $1 \times 10^{20}$ atoms/cm$^3$ while for the bulk silicon substrate 402 the dopant concentration is about $1 \times 10^{16}$ atoms/cm$^3$. The actual dopant is boron for the NFET device and phosphorous for the PFET device. Normally, boron would be the dopant for a PFET and phosphorous for the NFET but the reverse (boron for NFET and phosphorous for PFET) is desired for the well doping. The structure thus far is shown in FIG. 9.

Figure 10:
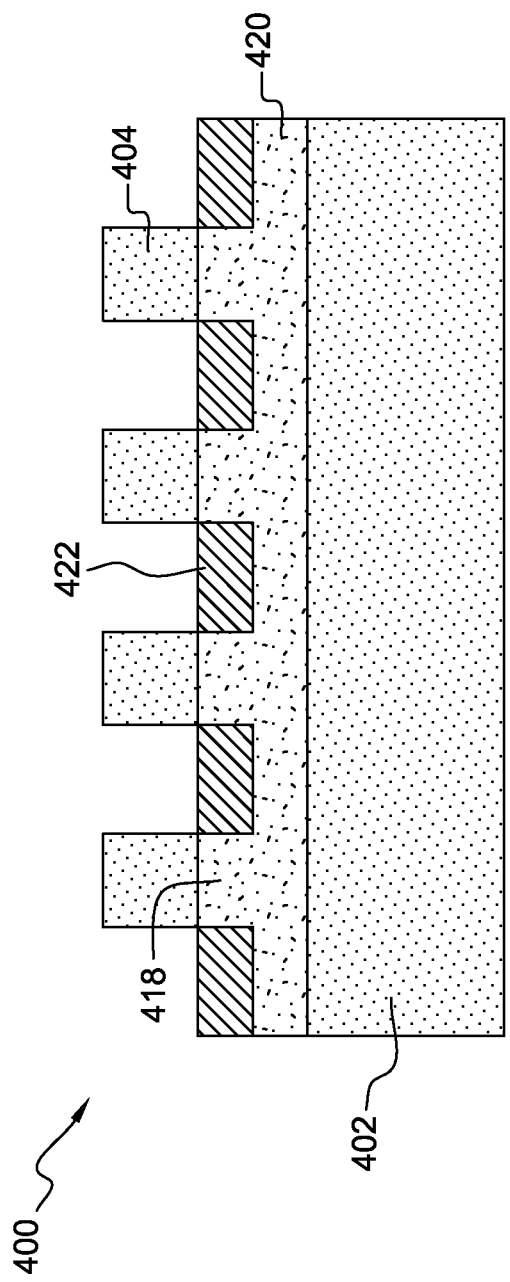

Referring now to FIG. 10, the dummy spacer 410 may be conventionally etched by a combination of physical ion bombardment and chemical reaction at the surface by flowing in $CF_4$ and $O_2/H_2$ for a silicon nitride etch. Thereafter, another layer of oxide 422 may be deposited by a process such as that used to deposit the oxide 406 in FIG. 4.

Further processing may now take place to form a gate structure that wraps around each of the fins 404 and additional conventional semiconductor processing steps to complete the FinFET structure 400.

FIGS. 11 to 14 illustrate a second exemplary process for doping of the fins wherein FIGS. 11 to 14 are cross-sectional views in the direction of arrows A-A in FIG. 2.

Referring now to FIG. 11, there is illustrated a starting FinFET structure 600 which includes a bulk silicon substrate 602 having a plurality of silicon fins 604. The silicon fins 604 preferably may be formed using the process in FIGS. 1A to 1H. In this second exemplary embodiment of FinFET structure 600, the process begins with a structure substantially identical to that shown in FIG. 6 and having dummy spacers 606. The FinFET structure 600 undergoes plasma doping to deposit a doping layer 612 in contact with the exposed bottom portions of the silicon fins 604 and bulk silicon substrate 602. Plasma doping is a technique characterized by the implantation of energetic impurity ions that are generated by immersing the substrate into a plasma and applying a negative bias voltage—pulsed bias in general—to the substrate. The system consists of a chamber, a RF power and a high vacuum pumping system, a high voltage pulse supply and gas supply system. The plasma doping source is a gas mixture of $PH_3$ or $B_2H_6$ and He gas. When the substrate is exposed to the plasma, the doping will be either impinging into or deposit onto the surface to achieve very shallow junction formation either in planar or vertical structure. The plasma doping will deposit either layers of phosphorous or boron dopants. The dummy spacers 606 protect the sides 608 and tops 610 of the silicon fins 604 from being in contact with the doping layer 612.

Referring to FIG. 12, the FinFET structure 600 undergoes either a rapid thermal anneal (RTA) or a furnace anneal, as described previously with respect to FIG. 8, to drive in the dopants (represented by arrows 614) to the bulk silicon substrate 602 and the portions of the silicon fins 604 exposed to the doping layer 612. The dummy spacers 606 protect the upper sidewalls 608 and the tops 610 of the fins 604 from the doping layer 612 and the drive in of the dopants from the doping layer 612.

The doping layer 612 may be stripped by, for example, ozone plasma ashing. The bottom portions 616 (in contact with the doping material 612) of the fins 604 become doped after the drive in of the dopants from the doping layer 612. The doped portion of the bulk silicon substrate 602 forms a well indicated by reference number 618. The well may have a thickness of about 30 nm. The FinFET structure may be doped in the same manner as the first exemplary embodiment. The structure thus far is shown in FIG. 13.

Referring now to FIG. 14, the dummy spacer 606 may be conventionally etched as described previously. Thereafter, another layer of oxide 620 may be deposited by a process such as that used to deposit the oxide 406 in FIG. 4.

Further processing may now take place to form a gate structure that wraps around each of the fins 604 and additional conventional semiconductor processing steps to complete the FinFET structure 600.

FIGS. 15 to 18 illustrate a third exemplary process for doping of the fins wherein FIGS. 15 to 18 are cross-sectional views in the direction of arrows A-A in FIG. 2.

Figure 15:
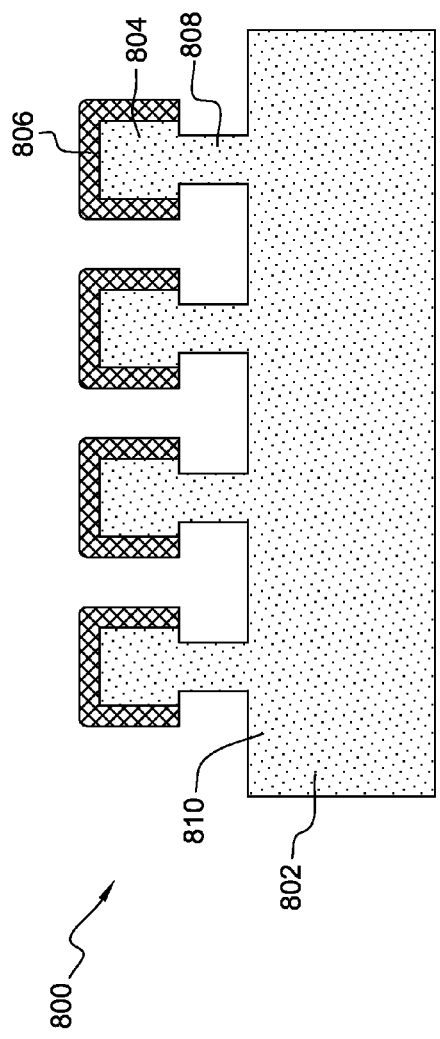

Referring now to FIG. 15, there is illustrated a starting FinFET structure 800 which includes a bulk silicon substrate 802 having a plurality of silicon fins 804. The silicon fins 804 preferably may be formed using the process in FIGS. 1A to 1H. In this third exemplary embodiment of FinFET structure 800, the process begins with the structure substantially identical to that shown in FIG. 6 and having dummy spacers 806.

Subsequently, the bottom portions 808 of the silicon fins 804 have been thinned by exposing the FinFET structure 800 to an etchant that anisotropically etches the exposed silicon. For purposes of illustration and not limitation, the etchant may be an etchant comprising a 25 weight percent solution of potassium hydroxide and water. The FinFET structure 800 is exposed to the etchant for a sufficient time to reduce each exposed silicon surface by about 2 to 3 nanometers (nm). The starting thickness of the silicon fins 804 is about 10 nm and after exposure to the etchant, the thickness of the bottom portion 808 is now about 4 to 6 nm. The surface 810 of the bulk silicon substrate 802 is also reduced by about 2 to 3 nm due to exposure to the silicon etchant.

Figure 16:
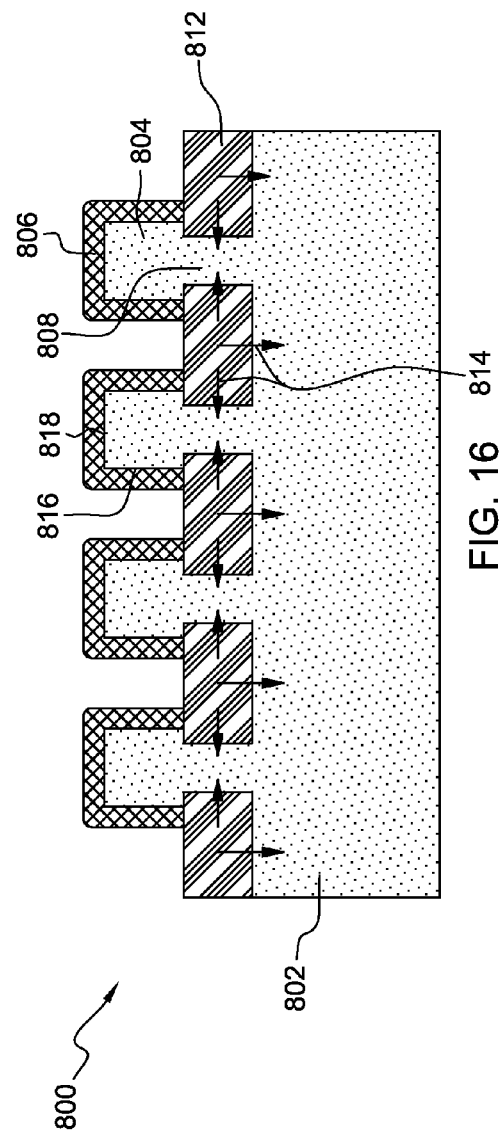

The FinFET structure 800 then undergoes an epitaxial process to grow either phosphorous-doped silicon (P-silicon), boron-doped silicon germanium (B-SiGe) or boron-doped silicon (B-Si) on the exposed bottom portions 808 of the silicon fins 804 and the bulk silicon substrate 802. The epitaxial process is the same as described previously. The epitaxial material 812 is shown in FIG. 16. The FinFET structure 800 then undergoes either a rapid thermal anneal (RTA) or a furnace anneal, as described previously, to drive in the dopants (represented by arrows 814) to the bulk silicon substrate 802 and the exposed bottom portions 808 of the silicon fins 804. The dummy spacer 806 protects the upper sidewalls 816 and the tops 818 of the fins 804 from the epitaxial material 812 and the drive in of the dopants from the epitaxial material 812.

Figure 17:
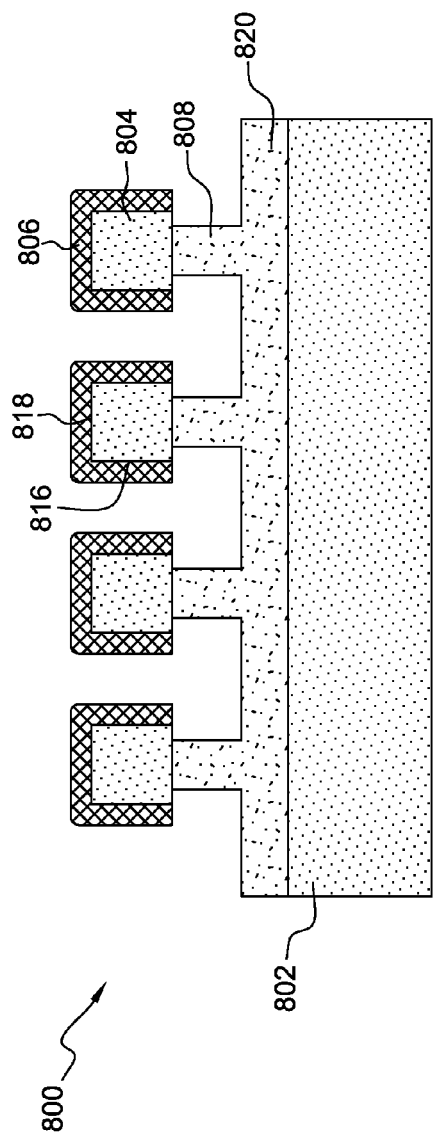

The epitaxial material 812 may be stripped by, for example, hydrochloric acid. The bottom portions 808 of the fins 804 become doped after the drive in of the dopants from the epitaxial material 812. The doped portion of the bulk silicon substrate 802 forms a well indicated by reference number 820. The well may have a thickness of about 30 nm. The FinFET structure 800 may be doped in the same manner as the first exemplary embodiment. The structure thus far is shown in FIG. 17.

Figure 18:
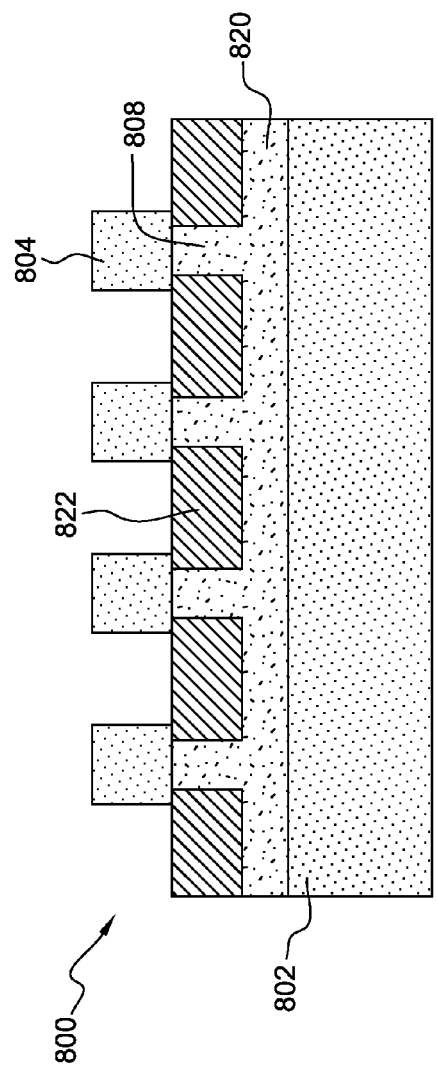

The dummy spacer 806 may be conventionally etched as described previously. Thereafter, another layer of oxide 822 may be deposited by a process such as that used to deposit the oxide 406 in FIG. 4. The resulting structure is shown in FIG. 18.

Further processing may now take place to form the gate structure that wraps around each of the fins 804 and additional conventional semiconductor processing steps to complete the FinFET structure 800.

Figure 19:
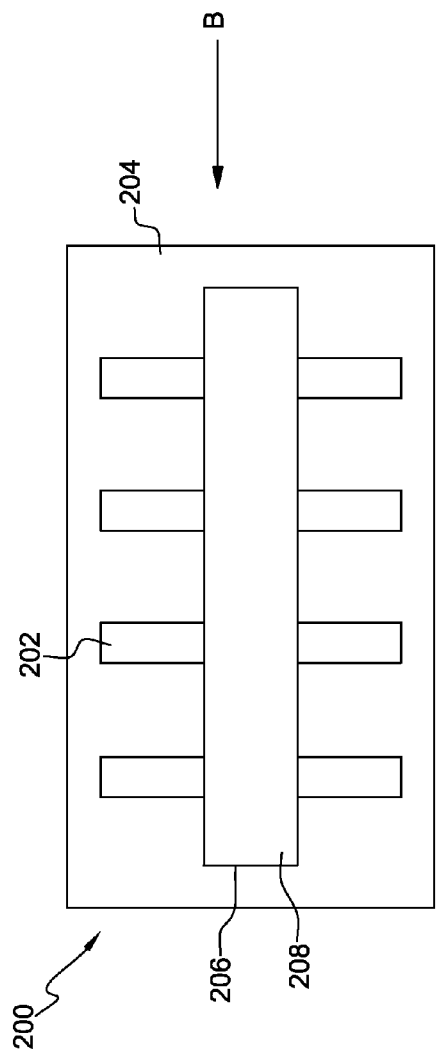
FIGS. 19 and 20 are views similar to FIGS. 2 and 3, respectively, except that FIGS. 19 and 20 illustrate the addition of a gate structure.
Figure 20:
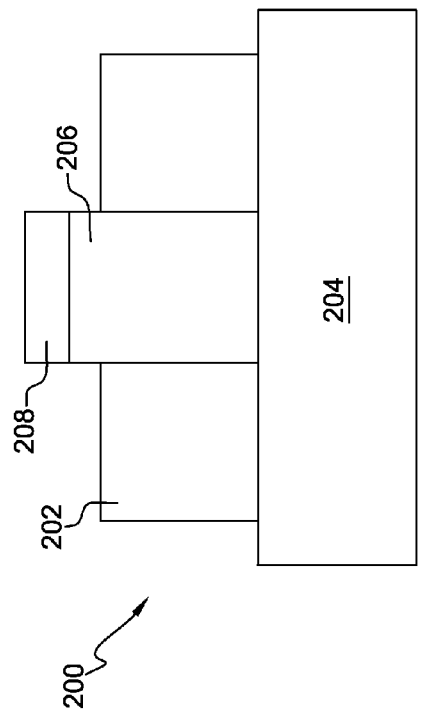

FIGS. 19 and 20 illustrate the formation of a gate structure 206 that wraps around the plurality of fins 202. The gate structure 206 may wrap around all or a plurality of fins 202, as shown in FIGS. 19 and 20, or there may be a separate gate structure for each of the fins 202. The gate structure 206 may also include a hard mask 208, such as a silicon nitride. The gate structure 206 may be formed in conjunction with any of the exemplary embodiments. The ends of the fins 202 may comprise a source and a drain and may further include P-silicon or B-SiGe epitaxial material (not shown).

The exemplary embodiments are advantageous in that uniform high concentration well doping is achieved to block the electrical path between the source and drain and minimize the junction leakage current. The third exemplary embodiment is particularly advantageous in that parasitic capacitance is reduced because the proportion of the channel exposed to the well is less due to the thinning of the fins.

It will be apparent to those skilled in the art having regard to this disclosure that other modifications of the exemplary embodiments beyond those embodiments specifically described here may be made without departing from the spirit of the invention. Accordingly, such modifications are considered within the scope of the invention as limited solely by the appended claims.

What is claimed is:

1. A method of forming a FinFET device comprising, in the following order:
    forming a plurality of semiconductor fins from a bulk semiconductor substrate;
    forming an oxide layer between each of the plurality of semiconductor fins, the oxide layer extending from the bulk semiconductor substrate only part way up a sidewall of each of the semiconductor fins to cover a bottom portion of each of the semiconductor fins, a top portion of the sidewall of each of the semiconductor fins being exposed and not covered by the oxide layer;
    forming a dummy spacer on the exposed top portion of each of the semiconductor fins;
    completely stripping the oxide layer to expose the bulk semiconductor substrate and the bottom portion of each of the semiconductor fins;
    depositing a doping material to be in contact with the exposed bulk semiconductor substrate and the bottom portion of each of the semiconductor fins previously covered by the oxide layer;
    heat treating the bulk semiconductor substrate to drive in dopants from the doping material into the exposed bulk semiconductor substrate and the bottom portion of each of the semiconductor fins;
    stripping only the doping material;
    forming a second oxide layer only in contact with the exposed bulk semiconductor substrate and the bottom portion of each of the semiconductor fins previously contacted by the doping material; and
    stripping the dummy spacer from each of the semiconductor fins.

2. The method of claim 1 wherein depositing a doping material is by epitaxial deposition.

3. The method of claim 2 wherein the doping material is phosphorous-silicon.

4. The method of claim 2 wherein the doping material is boron-silicon germanium or boron-silicon.

5. The method of claim 1 wherein depositing a doping material is by plasma deposition.

6. The method of claim 5 wherein the doping material is phosphorous.

7. The method of claim 5 wherein the doping material is boron.

8. The method of claim 1 wherein between completely stripping the oxide layer and depositing a doping material, further comprising thinning the exposed bottom portion of each of the semiconductor fins.

9. The method of claim 1 wherein the semiconductor fins and bulk semiconductor substrate are silicon.

10. The method of claim 1 further comprising forming a gate that wraps around at least one of the semiconductor fins.

* * * * *